United States Patent
Park et al.

(10) Patent No.: US 8,298,730 B2
(45) Date of Patent: Oct. 30, 2012

(54) SEMICONDUCTOR DEVICES AND METHODS OF MANUFACTURING THEREOF

(75) Inventors: O Seo Park, Hopewell Junction, NY (US); Sun-Oo Kim, Hopewell Junction, NY (US); Klaus Herold, Poughquag, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/072,227

(22) Filed: Mar. 25, 2011

(65) Prior Publication Data

US 2011/0171821 A1    Jul. 14, 2011

Related U.S. Application Data

(62) Division of application No. 11/960,195, filed on Dec. 19, 2007, now Pat. No. 7,939,942.

(51) Int. Cl.
    *G03F 1/20* (2012.01)
(52) U.S. Cl. ............................................. 430/5
(58) Field of Classification Search ........... 430/5, 311, 430/312, 313; 438/279, 619
    See application file for complete search history.

(56) References Cited

U.S. PATENT DOCUMENTS

| | | | |
|---|---|---|---|
| 4,933,743 A | 6/1990 | Thomas et al. | |
| 5,324,683 A | 6/1994 | Fitch et al. | |
| 5,461,003 A | 10/1995 | Havemann et al. | |
| 6,433,436 B1 | 8/2002 | Feild et al. | |
| 6,545,361 B2 | 4/2003 | Ueda et al. | |
| 6,576,976 B2 | 6/2003 | Lien et al. | |
| 8,158,306 B2 * | 4/2012 | Chen et al. .................. | 430/5 |
| 2002/0011673 A1 | 1/2002 | Uzoh | |
| 2003/0063705 A1 | 4/2003 | Nasser-Ghodsi et al. | |
| 2005/0082677 A1 | 4/2005 | Fan et al. | |
| 2007/0296064 A1 | 12/2007 | Gates et al. | |
| 2008/0042268 A1 | 2/2008 | Yu et al. | |
| 2008/0079152 A1 | 4/2008 | Tanaka et al. | |

* cited by examiner

*Primary Examiner* — Stephen Rosasco
(74) *Attorney, Agent, or Firm* — Slater & Matsil, L.L.P.

(57) ABSTRACT

Semiconductor devices, methods of manufacturing thereof, lithography masks, and methods of designing lithography masks are disclosed. In one embodiment, a semiconductor device includes a plurality of first features disposed in a first material layer. At least one second feature is disposed in a second material layer, the at least one second feature being disposed over and coupled to the plurality of first features. The at least one second feature includes at least one void disposed between at least two of the plurality of first features.

3 Claims, 5 Drawing Sheets

SEMICONDUCTOR DEVICES AND METHODS OF MANUFACTURING THEREOF

This is a divisional application of U.S. application Ser. No. 11/960,195, entitled "Semiconductor Devices and Methods of Manufacturing Thereof," which was filed on Dec. 19, 2007 now U.S. Pat. No. 7,939,942, and is incorporated herein by reference in its entirety.

TECHNICAL FIELD

The present invention relates generally to the fabrication of semiconductor devices, and more particularly to semiconductor devices, methods of manufacturing thereof, lithography masks, and methods of designing lithography masks.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography and etch processes to form circuit components and elements thereon.

There is a trend in the semiconductor industry towards reducing the size of features, e.g., the circuits, elements, conductive lines, and vias of semiconductor devices, in order to improve the performance of the semiconductor devices, for example. As feature sizes diminish, the patterning of conductive lines, transistor gates, and other circuit components becomes more challenging. The transfer of patterns of lithography masks to semiconductor devices having small feature sizes may be inaccurate in some applications. Diffraction and other effects in a lithography process or system may cause features formed on semiconductor devices to appear differently than patterns on a lithography mask and differently than the desired patterns.

Thus, what are needed in the art are improved semiconductor devices and methods of manufacturing thereof.

SUMMARY OF THE INVENTION

These and other problems are generally solved or circumvented, and technical advantages are generally achieved, by embodiments of the present invention, which provide novel semiconductor devices, methods of manufacture thereof, novel lithography masks, and novel methods of designing lithography masks.

In accordance with an embodiment of the present invention, a semiconductor device includes a plurality of first features disposed in a first material layer. At least one second feature is disposed in a second material layer, the at least one second feature being disposed over and coupled to the plurality of first features. The at least one second feature includes at least one void disposed between at least two of the plurality of first features.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments of the present invention and are not necessarily drawn to scale.

DETAILED DESCRIPTION OF ILLUSTRATIVE EMBODIMENTS

Figure 1:
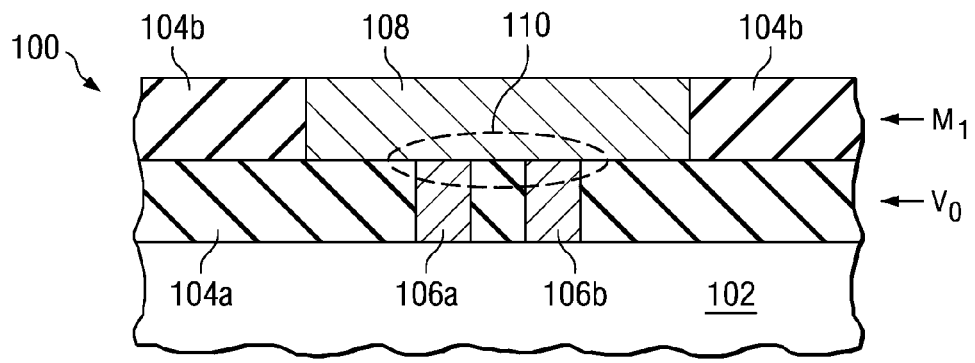
FIG. 1 is a cross-sectional view of a semiconductor device in accordance with an embodiment of the present invention, wherein a plurality of first features is disposed in a first material layer, and at least one second feature is disposed in a second material layer over the first material layer.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in specific contexts, namely implemented in conductive material layers of semiconductor devices. Embodiments of the invention may also be implemented in other types of material layers of semiconductor devices, for example. Embodiments of the present invention may be used to pattern and form features comprising an insulating material, a conductive material, a semiconductive material, or combinations thereof, for example.

In many semiconductor designs and applications, the upper material layers of a device comprise one or more metallization layers that provide interconnection for the underlying active regions and circuitry formed over a semiconductor workpiece. These upper material layers of semiconductor devices are often formed in a stage of a manufacturing process flow that is often referred to as a back end of the line (BEOL).

Multiple layers of metallization may be used in a multi-layer interconnect system of a semiconductor device, for example. Conductive line layers may be connected to other adjacent conductive line layers by vias formed in via layers in a multi-layer interconnect system. The conductive lines typically comprise a width comprising a minimum feature size, and the vias typically comprise a width and length also comprising the minimum feature size for a semiconductor device in some applications, for example.

In some semiconductor device designs, in order to achieve higher current drive capability, some conductive lines in a conductive line layer are designed to be wider than others. For example, wide lines may be used for certain connections that are about three times the width of narrow lines having a minimum feature size width. Multiple vias may be used to connect each such wide line to an underlying or overlying wide line in other conductive line layers.

However, alignment of the vias to such wide lines is problematic, due to the nature of the lithography and reactive ion etch (RIE) processes used to pattern the conductive line and via layers. The vias may not land fully on a previously formed wide line due to the set-back or reduction in the wide line width from the lithography and RIE processes, resulting in less than 100% via coverage, for example. Via coverage of less than 80% has been observed in such designs, for example. The wide lines formed may have a narrower width than designed, resulting in vias not fully landing on the wide lines, which decreases the current drivability of the semiconductor device design.

Thus, what are needed in the art are methods of patterning wide conductive lines with improved alignment to via levels in multi-layer interconnect schemes, and structures thereof.

Embodiments of the present invention achieve technical advantages by providing novel methods of forming conductive lines and structures thereof. A void is formed in a conductive line pattern proximate a via contact region of the conductive line pattern, resulting in improved pattern transfer in the void region and improved alignment of vias to the conductive lines, to be described further herein.

FIG. 1 is a cross-sectional view of a semiconductor device 100 in accordance with an embodiment of the present invention, wherein a plurality of first features 106a and 106b is disposed in a first material layer $V_0$ over a workpiece 102, and at least one second feature 108 is disposed in a second material layer $M_1$ over the first material layer $V_0$. The at least one second feature 108 is disposed over and is coupled to the plurality of first features 106a and 106b. The plurality of first features 106a and 106b comprises conductive vias, and the at least one second feature 108 comprises a conductive line in some embodiments. Alternatively, the plurality of first features 106a and 106b and the at least one second feature 108 may comprise other types of circuit elements.

The first material layer $V_0$ comprises a first via level of the semiconductor device 100, and the second material layer $M_1$ comprises a first metallization layer or first conductive line layer of the semiconductor device 100 in some embodiments, for example. Alternatively, the material layer $V_0$ and material layer $M_1$ may comprise other levels of conductive layers in a multi-level interconnect structure, such as $V_x$ and $M_x$, wherein x=0 through about 8 to 12, for example, although other numbers of metallization layers may also be used. Only one second feature 108 is shown in FIG. 1, and only two first features 106a and 106b are shown; however, preferably, a plurality of second features 108 and many other first features 106a and 106b may be formed across a surface of the semiconductor device 100 in some embodiments, for example. A first insulating material 104a is disposed between the first features 106a and 106b, and a second insulating material 104b is disposed between the second features 108.

Figure 2:
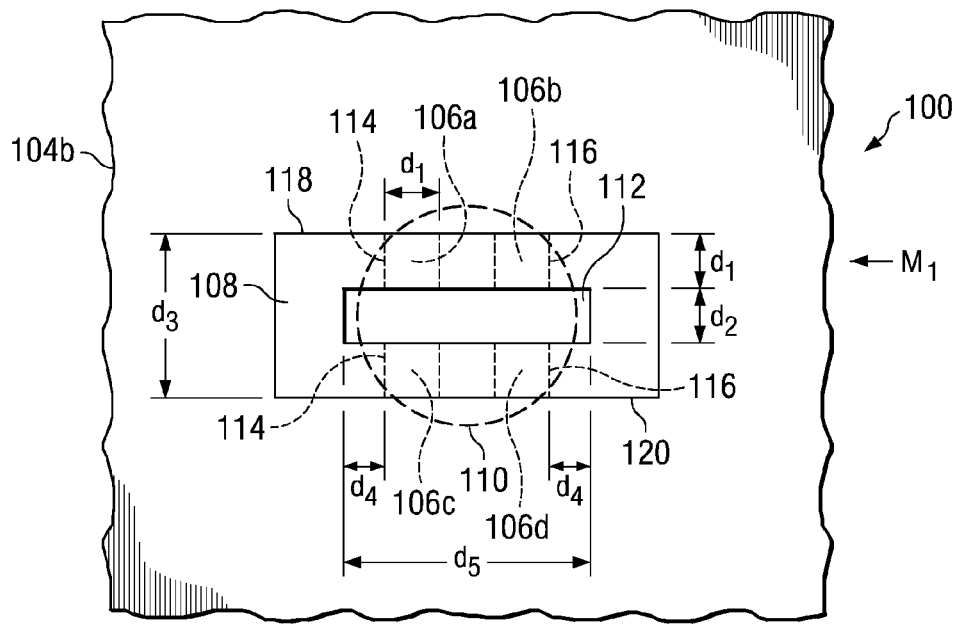
FIG. 2 shows a top view of the semiconductor device shown in FIG. 1, illustrating a void of the at least one second feature that is formed between at least two of the plurality of first features in a via contact region.

FIG. 2 shows a top view of the material layer $M_1$ of the semiconductor device 100 shown in FIG. 1, illustrating a void 112 in the at least one second feature 108 that is formed in a via contact region 110. The via contact region 110 comprises a region where the plurality of first features 106a, 106b, 106c, and 106d comprising vias are coupled to the second feature 108 comprising at least one conductive line. The plurality of first features 106a, 106b, 106c, and 106d may comprise an array of four vias arranged in two rows and two columns, as shown, although alternatively, other numbers of vias 106 may be arranged in other numbers of rows and columns, for example.

The void 112 is shown in FIG. 2 comprising a substantially rectangular shape; alternatively, the void 112 may comprise a substantially square, round, elliptical, or other shape, as examples. The void 112 may be substantially round or square in the pattern of a lithography mask, and after patterning a semiconductor device 100 with the mask, the pattern may have rounded edges, forming a elliptical or round void 112 (not shown in FIG. 2; see FIG. 9 at 412). The void 112 may be formed in a substantially central region of the via contact region 110, for example, as shown.

The void 112 is also referred to herein as at least one void 112. The void 112 may comprise two or more voids disposed between at least two of the first features or vias 106a, 106b, 106c, and 106d, for example, to be described further herein. The at least one void 112 is also referred to herein as at least one first void, for example.

The void 112 is formed between at least two of the plurality of first features 106a, 106b, 106c, or 106d (shown in phantom in FIG. 2) in accordance with embodiments of the present invention. For example, the void 112 in the second feature 108 is formed between first features 106a and 106c and also between first features 106b and 106d. The void 112 extends from between the first features 106a and 106c to between the first features 106b and 106d, e.g., from left to right in the view shown in FIG. 2.

Note that in the drawings, the first features 106a, 106b, 106c, and 106d comprise four vias; alternatively, the first features may comprise two or more vias. For example, the first features 106a, 106b, 106c, and 106d coupled to each conductive line 108 may comprise two, three, five, or six or more vias.

Each of the plurality of first features 106a, 106b, 106c, and 106d comprises a dimension $d_1$. The dimension $d_1$ is also referred to herein as a first width. The dimension $d_1$ may comprise a minimum feature size of a lithography system used to manufacture the semiconductor device 100, for example, although alternatively, dimension $d_1$ may be larger than the minimum feature size of the semiconductor device 100. Note that each of the plurality of first features 106a, 106b, 106c, and 106d is shown in FIG. 2 as being square; alternatively, the plurality of first features 106a, 106b, 106c, and 106d may be round, as shown in phantom in FIG. 9, having a diameter substantially equal to dimension $d_1$, for example.

Referring again to FIG. 2, the void 112 comprises a dimension $d_2$ on one side. The dimension $d_2$ is also referred to herein as second width. The second width $d_2$ is substantially the same as the first width $d_1$ in some embodiments, although alternatively, the second width $d_2$ may comprise other dimensions. The dimension $d_2$ may comprise a minimum feature size of the lithography system used to manufacture the semiconductor device 100, for example, although alternatively, dimension $d_2$ may be larger than the minimum feature size of the semiconductor device 100.

The second feature 108 comprises a dimension $d_3$ or width that is larger than dimension $d_1$ and $d_2$. The dimension $d_3$ may comprise about three times a size of the first features 106a, 106b, 106c, or 106d, for example, although alternatively, dimension $d_3$ may comprise other dimensions. The dimension $d_3$ may comprise about three times $d_1$ in some embodiments, for example. The second feature 108 may comprise a length extending in a direction perpendicular to the width $d_3$ of about a few nm to several μm, as examples. The second feature 108 is preferably larger than each of the plurality of first features 106a, 106b, 106c, or 106d, for example. The second feature 108 comprises an elongated conductive feature that is slotted, e.g., the void 112 forms a slot in the conductive feature.

The void 112 of the second feature 108 may extend past the first features 106a, 106b, 106c, and 106d in the via contact region 110 by a dimension $d_4$ in some embodiments, as shown. Dimension $d_4$ may comprise at least about ¼ of a width $d_1$ of a first feature 106a, 106b, 106c, and 106d. Alternatively, dimension $d_4$ may comprise about one or more widths $d_1$ of the first features 106a, 106b, 106c, and 106d or greater, for example.

The void 112 may comprise a dimension $d_5$ comprising a length in a direction that is perpendicular to the direction of dimension $d_2$ or the width of the void 112 in the top view shown in FIG. 2. Dimension $d_5$ may comprise about three times dimension $d_1$ of the first features 106a, 106b, 106c, and 106d in some embodiments. In other embodiments, dimension $d_5$ may comprise greater than three times dimension $d_1$, e.g., by twice $d_4$. In embodiments where only two first features 106a and 106c are included in material layer $V_0$, dimension $d_5$ may be substantially the same as dimension $d_1$, or alternatively, dimension $d_5$ may comprise dimension $d_1$ plus twice dimension $d_4$, as examples. Alternatively, the void 112 may comprise a width $d_2$ and a length $d_5$ sufficient to improve alignment of the conductive line 108 to the vias 106a, 106b, 106c, and 106d in some embodiments, as another example.

Figure 3:
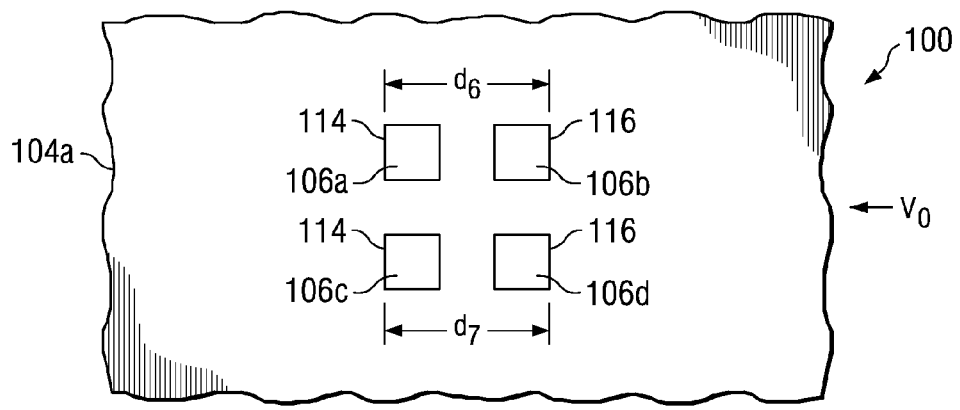
FIG. 3 shows a top view of the plurality of first features formed in the first material layer.

FIG. 3 shows a top view of the plurality of first features 106a, 106b, 106c, and 106d formed in the first material layer $V_0$. First features 106a and 106b are also referred to herein as first vias, and first features 106c and 106d are also referred to herein as second vias. A dimension $d_6$, also referred to herein as a first length, is defined from a first side 114 of one of the first vias, e.g., first via 106a, and a second side 116 of another of the first vias, e.g., first via 106b. A dimension $d_7$, also referred to herein as a second length, is defined from a first side 114 of one of the second vias, e.g., second via 106c, and a second side 116 of another of the second vias, e.g., second via 106d. The second length or dimension $d_7$ may be substantially the same as the first length or dimension $d_6$, for example, as shown. Alternatively, the second length or dimension $d_7$ may be different than the first length or dimension $d_6$, for example.

The void 112 of the second feature 108 preferably extends at least substantially the entire first length or dimension $d_6$, or at least substantially the entire second length or dimension $d_7$ in some embodiments. In other embodiments, the length of the void 112 comprising dimension $d_5$ comprises a third length, wherein the third length or dimension $d_5$ is greater than the first length or dimension $d_6$ or wherein the third length or dimension $d_5$ is greater than the second length or dimension $d_7$, e.g., by about twice the dimension $d_4$.

Referring again to FIG. 2, the plurality of first features 106a, 106b, 106c, and 106d may comprise at least one first via 106a and 106b and at least one second via 106c and 106d. The at least one second feature 108 may comprise a conductive line 108 having a first edge 118 and a second edge 120 opposite the first edge 118. The at least one first via 106a and 106b is disposed proximate the first edge 118 of the conductive line 108, e.g., beneath the conductive line 108. The at least one second via 106c and 106d is disposed proximate the second edge 120 of the conductive line 108, beneath the conductive line 108. The void 112 is preferably formed within the conductive line 108 between the at least one first via 106a and 106b and the at least one second via 106c and 106d.

The at least one first via 106a and 106b is advantageously substantially fully landed beneath the conductive line 108 proximate the first edge 118. Likewise, the at least one second via 106c and 106d is substantially fully landed beneath the conductive line 108 proximate the second edge 120.

Referring again to FIG. 1, to fabricate the semiconductor device 100, first, a workpiece 102 is provided. The workpiece 102 may include a semiconductor substrate or body comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

The plurality of first features 106a, 106b, 106c, and 106d may then be formed over the workpiece 102. The plurality of first features 106a, 106b, 106c, and 106d may be formed using a single damascene process in some embodiments, for example. In a damascene process, an insulating material 104a is formed over the workpiece 102. The insulating material 104a may comprise silicon dioxide, silicon nitride, a low dielectric constant (k) dielectric material having a k value of less than about 3.9, or combinations or multiple layers thereof, as examples. The insulating material 104a may include one or more liners and/or an etch stop layer, for example, not shown. The insulating material 104a may also comprise other materials or combinations of materials, for example.

Figure 5:
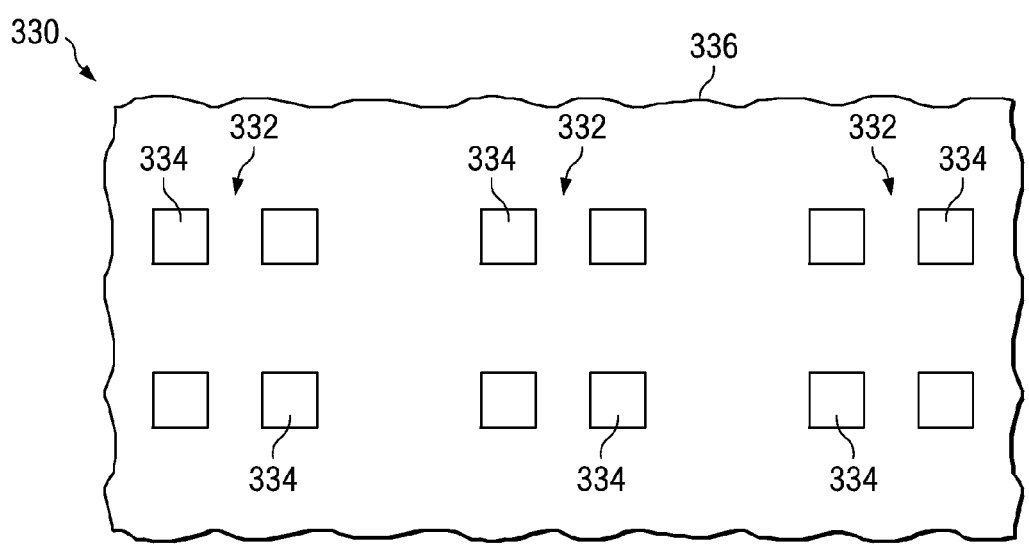
FIG. 5 shows a top view of a first lithography mask for patterning a first material layer in accordance with an embodiment of the present invention.

The insulating material 104a is patterned using a lithography mask such as mask 330 shown in FIG. 5, to be described further herein. For example, a first layer of photosensitive material comprising a photoresist (not shown), as an example, is deposited over the insulating material 104a. The first layer of photosensitive material is exposed to energy using the lithography mask 330, to transfer the pattern of the mask 330 to the first layer of photosensitive material. The first layer of photosensitive material is developed, and exposed (or unexposed, depending on whether the photosensitive material comprises a positive or negative resist, for example) portions of the photosensitive material are removed. The insulating material 104a is then exposed to an etch process such as a wet etch, a dry etch, or a RIE process, as examples, removing the exposed portions of the insulating material 104a.

The layer of photosensitive material is then removed, and the patterned insulating material 104a is filled with a conductive material. The conductive material may comprise a metal such as copper, aluminum, alloys thereof, and may include one or more seed layers or liners, for example, although alternatively, the conductive material may comprise other materials. Excess portions of the conductive material are removed from the top surface of the insulating material 104a using a chemical-mechanical polishing (CMP) process, an etch process, or combinations thereof, for example. The conductive material left remaining within the insulating material 104a comprises the plurality of first features 106a, 106b, 106c, and 106d comprising vias.

The conductive material layer $M_1$ may also be formed using a single damascene process. For example, a second insulating material 104b comprising similar materials described for the first insulating material 104a is formed over the first insulating material 104a and over the plurality of first features 106a, 106b, 106c, and 106d. A second layer of photosensitive material (not shown) is formed over the second insulating material 104b, and the second layer of photosensitive material is patterned using a second lithography mask such as mask 340 shown in FIG. 7, to be described further herein. The pattern from the second layer of photosensitive material is transferred to the second insulating material 104b using an etch process such as those described for material layer $V_0$, the second layer of photosensitive material is removed, and the patterned second insulating material 104b is filled with a conductive material comprising similar materials as described for material layer $V_0$. Excess conductive material is removed from the top surface of the insulating material 104b using a CMP and/or etch process.

Processing of the semiconductor device 100 is then continued to complete the device 100, such as forming additional via layers and conductive line layers over material layer $M_1$, and forming contact layers over the final metallization layers. The wafer or workpiece 102 is then singulated into individual die and may optionally be packaged, for example.

Advantageously, the void 112 in the pattern for the second feature 108 improves the alignment of the second feature 108 in the via contact region 110 to the first features 106a, 106b, 106c, and 106d. Without the void 112, the lithography and etch processes used to pattern the second feature 108 may result in the narrowing of the second feature 108 so that the first features 106a, 106b, 106c, and 106d extend beyond the edges of the second feature 108, resulting in not fully landed vias 106a, 106b, 106c, and 106d, which is a problem in some semiconductor device designs.

Material layers $V_0$ and $M_1$ may also be formed using a dual damascene technique, wherein a single insulating material layer 104a/104b is deposited. A bottom portion 104a of the insulating material layer is patterned with the pattern for the first features 106a, 106b, 106c, and 106d, and a top portion 104b of the insulating material layer is patterned with the pattern for the second feature 108. The patterning steps may comprise via-first or via-last methods of patterning the insulating material layer 104a/104b, for example. The two patterns are then filled simultaneously in a single conductive material fill process, and excess amounts of the conductive material are removed from the top surface of the insulating material 104b using a CMP and/or etch process, leaving the first features 106a, 106b, 106c, and 106d and second feature 108 formed within the insulating material 104a/104b.

In other embodiments, the first features 106a, 106b, 106c, and 106d and the second feature 108 may be formed using subtractive etch processes, e.g., by depositing a conductive material, patterning it using a subtractive etch process, and then filling the gaps between the conductive material with the insulating materials 104a and 104b, for example.

Embodiments of the present invention may be implemented in three or more conductive material layers of a semiconductor device 100. For example, in the embodiment shown in FIG. 1, the first features 106a and 106b comprise vias that make electrical contact to portions of the workpiece 102. Alternatively, the first features 106a and 106b may comprise vias that make electrical contact to an underlying conductive line. The conductive line may include a void in a central region of the via contact region, similar to the novel second feature 108 comprising the conductive line having a void 112 in via contact region 110.

Figure 4:
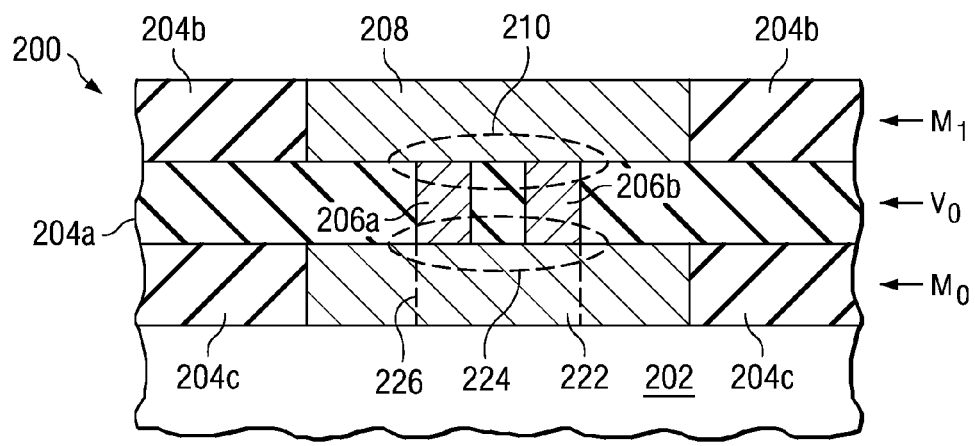
FIG. 4 illustrates a cross-sectional view of another embodiment of the present invention, wherein at least one third feature having a void between at least two of the plurality of first features is formed beneath the plurality of first features.

For example, FIG. 4 illustrates a cross-sectional view of another embodiment of the present invention, wherein at least one third feature 222 is formed in an insulating material layer 204c beneath the plurality of first features 206a and 206b in another conductive line layer $M_0$. The at least one third feature 222 may include a void (not shown in FIG. 4; see void 464 shown in the top view of FIG. 9) formed in a via contact region 224 between at least two of the plurality of first features 206a and 206b, which further improves the alignment of the vias 206a and 206b to the third feature 222. Like numerals are used for the various elements in FIG. 4 that were used to describe FIGS. 1 through 3. To avoid repetition, each reference number shown in FIG. 4 is not described again in detail herein. Rather, similar materials x02, x04, x06, x08, etc. . . . are preferably used for the various material layers shown as were described for FIGS. 1 through 3, where x=1 in FIGS. 1 through 3 and x=2 in FIG. 4.

The at least one third feature 222 is also referred to herein as an at least one second conductive line. The at least one third feature 222 may be disposed parallel to the at least one second feature 208, as shown in FIG. 4. Alternatively, the at least one third feature 222 may be disposed perpendicular to the at least one second features 208, as shown in phantom at 226 and as shown in phantom in a top view in FIG. 9. The at least one third feature 222 may also include a void (again, not shown in FIG. 4; see FIG. 9 at 464) proximate a via contact region 224. The void of the at least one third feature 222 is also referred to herein as a second void, for example. The at least one third feature 222 may comprise a similar size, shape, dimension, and material as the at least one second feature 208 described herein, for example.

Additional via layers, e.g., in via levels $V_1, V_2, \ldots V_x$ of the semiconductor devices 100 and 200 may be patterned with vias similar to the plurality of first features 106a, 106b, 106c, 106d, 206a, and 206b described herein. Additional conductive line layers, e.g., in conductive line layers $M_2, M_3, \ldots M_x$ of the semiconductor devices 100 and 200 may be patterned with conductive lines similar to the second features 108 and 208 and third feature 222 having voids 112 formed in a via contact region 110, 210, or 224 in accordance with embodiments of the present invention, not shown.

Embodiments of the present invention include semiconductor devices 100 and 200 that include the novel conductive lines 108, 208, and 222 having voids 112 formed therein. Embodiments of the present invention also include methods of fabricating the semiconductor devices 100 and 200 described herein, for example.

For example, referring to FIGS. 1 through 3 and FIGS. 5 through 8, in accordance with an embodiment, a method of manufacturing a semiconductor device 100 includes providing a design for a first layout for a first material layer $V_0$ and a second layout for a second material layer $M_1$ of the semiconductor device 100. The first layout for the first material layer $V_0$ comprises a pattern for the plurality of first features 106a, 106b, 106c, 106d, and the second layout for the second material layer $M_1$ comprises a pattern for the at least one second feature 108.

Figure 6:
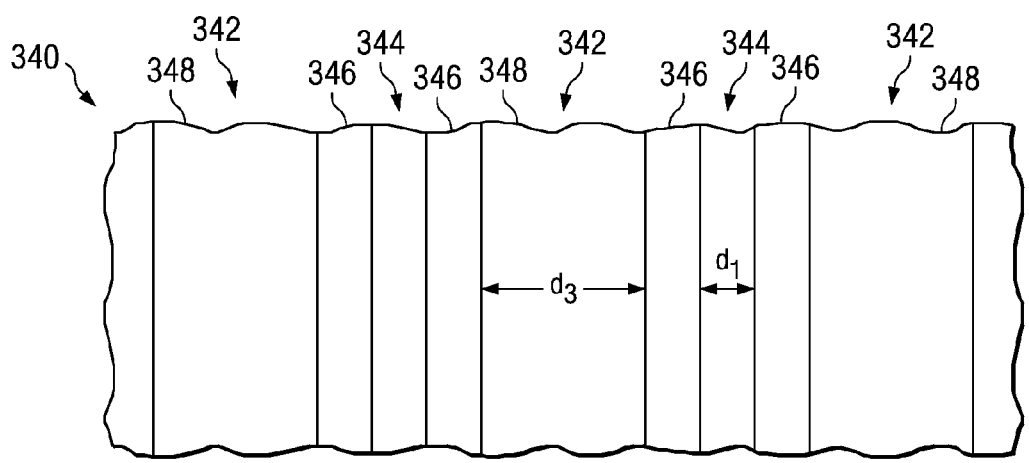
FIG. 6 shows a top view of an initial design for a second lithography mask for patterning a second material layer.

FIG. 5 shows a top view of a first lithography mask 330 for patterning a first material layer $V_1$ in accordance with an embodiment of the present invention. The layout for the first material layer $V_0$ is shown in the lithography mask 330 of FIG. 5. FIG. 6 shows a top view of an initial design for a second lithography mask 340 for patterning a second material layer $M_1$. The layout for the second material layer $M_1$ is shown in the lithography mask 340 of FIG. 6. The mask 330 for the first material layer $V_0$ includes a substantially opaque material 334 comprising a pattern 332 for a plurality of first features 306 (see FIG. 8) comprising vias, and a substantially transparent material 336. The layout for the mask 340 for the second material layer $M_1$ includes a pattern 342 for a plurality of second features 308 (see FIG. 8) comprising wide lines.

In an optional embodiment, the layout for the mask 340 may also include a pattern 344 for a plurality of narrow lines proximate the wide line pattern 342, as shown. The optional pattern 344 for the narrow lines comprises a smaller width than the width of the patterns 342 for the wide lines.

The mask 340 shown in FIG. 6 is not actually fabricated in accordance with embodiments of the present invention: the mask 340 of FIG. 6 is shown to illustrate the initial desired design layout of the mask 340 for the second material layer $M_1$ comprising a conductive line pattern 342 and 344. However, if the mask 340 were to be fabricated, the mask 340 would include a substantially transparent material 346 and a substantially opaque material 348 comprising the patterns 342 and 344.

The lithography system (not shown) used to pattern the material layers $V_0$ and $M_1$ of the semiconductor device 100 may comprise a magnification of about 1:1, 2:1, or 4:1, as examples, although alternatively, other magnification factors may also be used. The lithography system may comprise a lithography system that utilizes ultraviolet (UV) or extreme UV (EUV) light, an optical lithography system, an x-ray lithography system, an interference lithography system, or an immersion lithography system, as examples, although alternatively, other lithography systems may also be used.

The width of the via patterns 332 on mask 330 correspond to the dimension $d_1$ of the width of the vias formed. For example, in a lithography system having a 1:1 magnification factor, the width of the via patterns 332 of the mask 330 is substantially equal to dimension $d_1$ shown in FIG. 2. If other than a 1:1 magnification factor is used, dimension $d_1$ of the mask 330 is adjusted by the magnification factor. Likewise, the width of the patterns 342 for the wide conductive lines 308 (see FIG. 8) comprises a dimension $d_3$ that corresponds to the dimension $d_3$ of the width of the conductive lines 308 formed. The width of the patterns 344 for the optional narrow conductive lines may comprise a dimension $d_1$ that corresponds to a minimum feature size of the semiconductor device 300, for example, although alternatively, the width of the patterns 344 for the narrow lines may comprise other dimensions.

Figure 7:
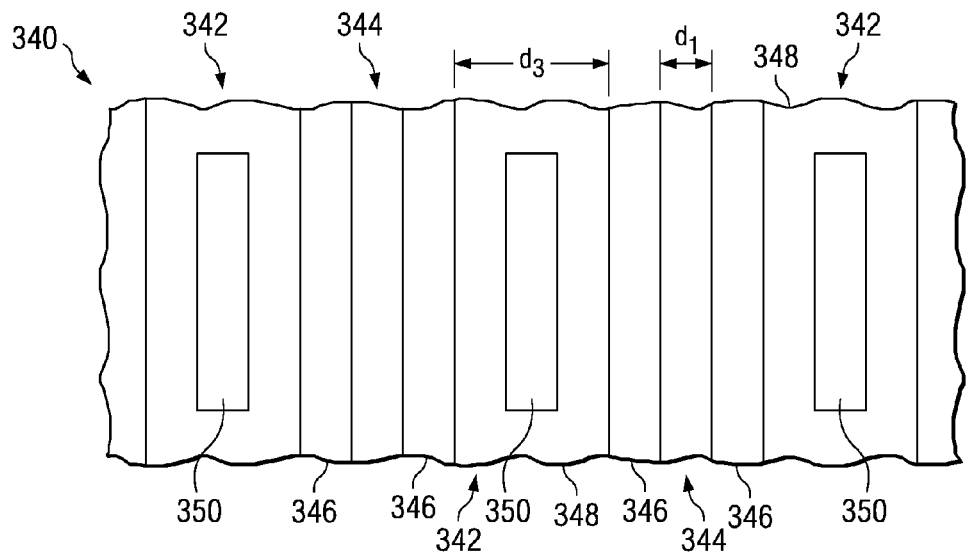
FIG. 7 shows a top view of a second lithography mask for patterning the second material layer that has been modified in accordance with an embodiment of the present invention.

The novel method of manufacturing the semiconductor device 300 includes modifying the second layout for the second material layer $M_1$ of the semiconductor device shown in FIG. 6 to include a pattern 350 for a void in the pattern 342 for the at least one second feature 308, as shown in FIG. 7. FIG. 7 shows a top view of a second lithography mask 340 for patterning the second material layer $M_1$ that has been modified in accordance with an embodiment of the present invention.

To manufacture a semiconductor device 300 (see FIG. 8) in accordance with an embodiment of the present invention, a first lithography mask 330, shown in FIG. 5, is fabricated that includes the first layout for the first material layer $V_0$. A second lithography mask 340, shown in FIG. 7, is fabricated that includes the modified second layout for the second material layer $M_1$.

Figure 8:
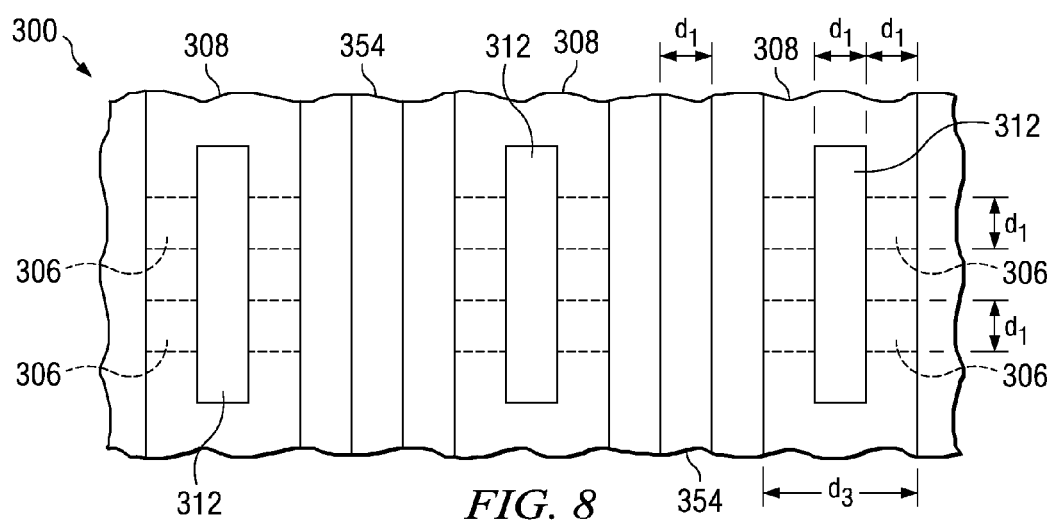
FIG. 8 shows a top view of a second material layer patterned with the lithography mask of FIG. 7.

A semiconductor device 300, shown in a top view in FIG. 8, is then fabricated using the first lithography mask 330 of FIG. 5 and the second lithography mask 340 of FIG. 7. Again, like numerals are used for the various elements in FIG. 8 that were used to describe the previous figures, and to avoid repetition, each reference number shown in FIG. 8 is not described again in detail herein. In accordance with the method, a plurality of first features 306 is formed, and at least one second feature 308 is formed over the plurality of first features 306. Each of the second features 308 comprises a void 312 in the second feature 308 between at least two of the plurality of first features 306. The optional narrow conductive lines 354 may be formed in the second material layer $M_1$, disposed between and/or proximate the wide conductive lines 308 having the void 312 formed therein.

Figure 9:
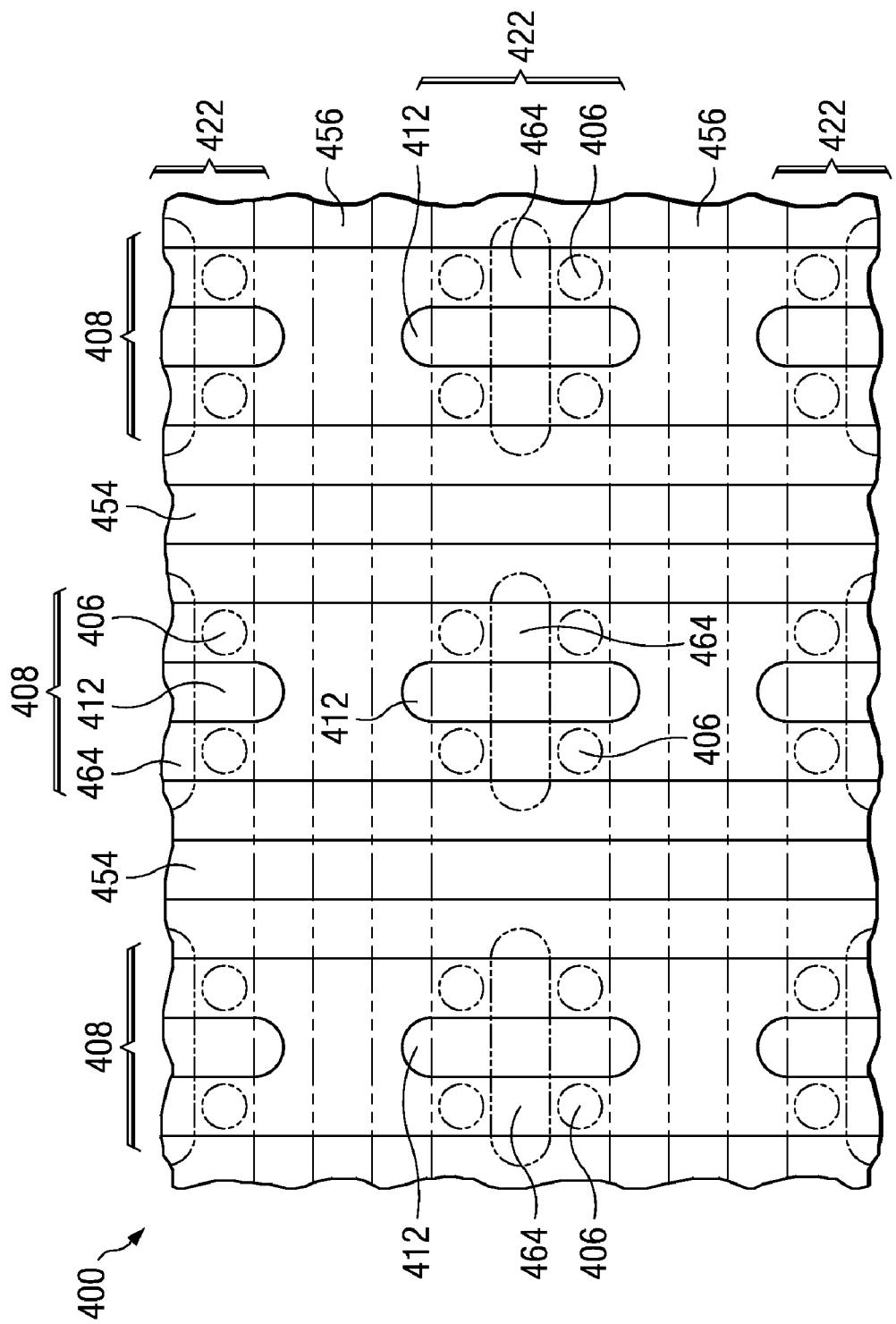
FIG. 9 shows a top view of a semiconductor device in accordance with an embodiment of the present invention, wherein the third features are disposed perpendicular to the second features, beneath the plurality of first features.

In some embodiments, third features 422 or wide conductive lines may also be formed in a material layer (e.g., material layer $M_0$ shown in FIG. 4 in a cross-sectional view) disposed below the plurality of vias 406, as shown in a top view in FIG. 9. The conductive lines 422 are shown disposed perpendicular to the conductive lines 408 in the embodiment shown in FIG. 9, for example. The vias 406 are disposed between the conductive lines 408 and 422 at the intersections or crossovers of the conductive lines 408 and 422, for example. Conductive lines 408 in the top or $M_1$ material layer are disposed in a vertical direction, and conductive lines 422 in the lower material layer $M_0$ are disposed in a horizontal direction. Note that narrow conductive lines 456 may optionally also be formed in the lower material layer $M_0$ proximate the wide conductive lines 422, as shown.

Because voids 412 and 464 are formed in both the first conductive lines 408 and the second conductive lines 422, respectively, alignment of vias 406 to both conductive lines 408 and 422 is advantageously improved, in accordance with this embodiment of the present invention. The wider conductive lines 408 and 422 may be used for signals requiring a larger amount of current, and the thinner narrow conductive lines 454 and 456 may be used for signals that do not require as much current, for example. The novel voids 412 and 464 in the conductive lines 408 and 422 ensure that the vias 406 are fully landed to the conductive lines 408 and 422 in the via contact region, decreasing the resistance of the overall interconnect structure and allowing the use of a greater amount of current through the wide lines 408 and 422.

Embodiments of the present invention also include including a plurality of voids in a conductive line pattern. For example, a plurality of voids 412 and 464 is shown formed along the length of the conductive lines 408 and 422, respectively, in FIG. 9.

Figure 10:
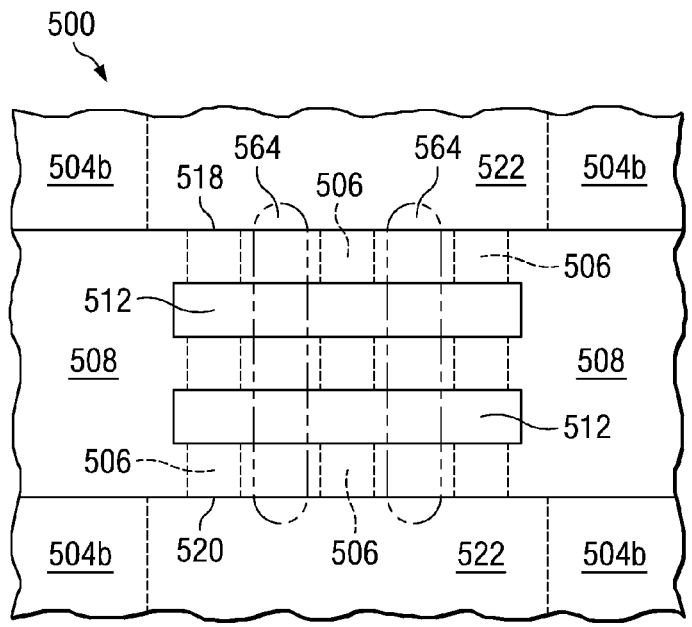
FIG. 10 illustrates a top view of a semiconductor device in accordance with yet another embodiment of the present invention, wherein the plurality of second features comprises an array of nine vias arranged in rows and columns and wherein the first feature includes two voids between the rows of vias.

As another example, FIG. 10 illustrates a top view of a semiconductor device 500 in accordance with yet another embodiment of the present invention, wherein the plurality of second features 506 comprises an array of nine vias 506 arranged in three rows and three columns. The first feature 508 comprises a conductive line 508 that includes two voids 512, with each void 512 between disposed between two adjacent rows of vias 506. The top void 512 is disposed between the top two rows of vias 506, and the bottom void 512 is disposed between the bottom two rows of vias 506, for example. A third feature 522 comprising a conductive line 522 may be disposed beneath the array of vias 506, as shown in phantom, wherein the third feature 522 includes two voids 564, also shown in phantom. Each void 564 is disposed between two adjacent columns of vias 506. Thus, a plurality of voids 512 may be disposed between a top edge 518 and a bottom edge 520 of the conductive line 508, for example, in accordance with embodiments of the present invention.

Figure 11:
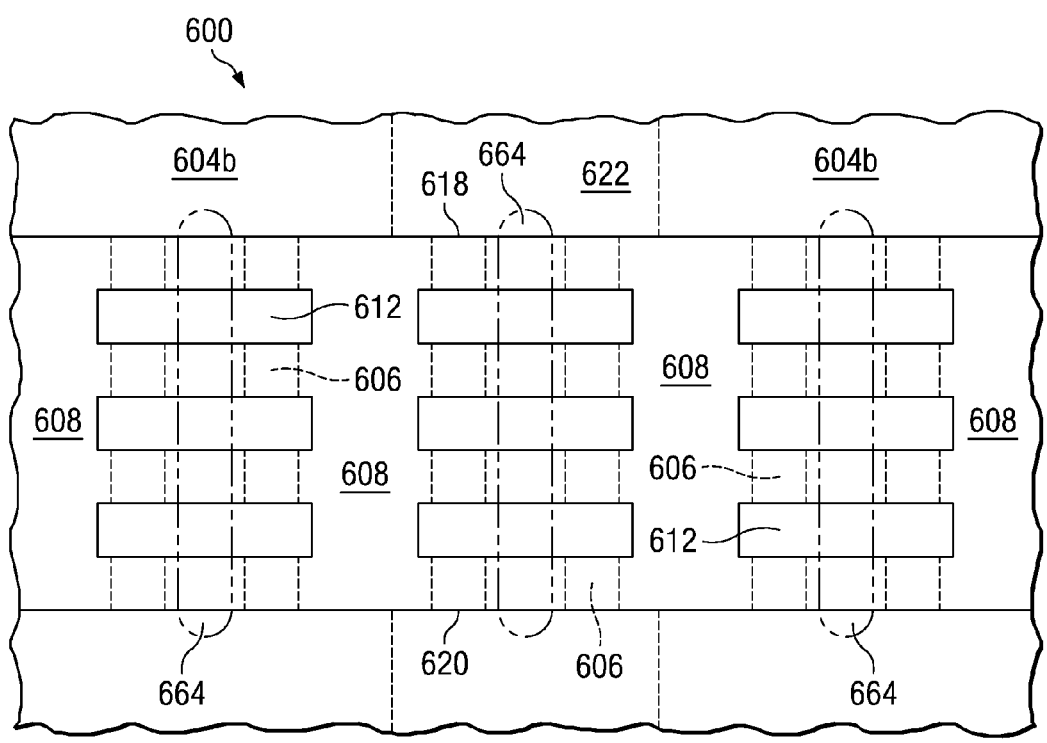
FIG. 11 illustrates a top view of another embodiment of the present invention, wherein a plurality of voids is disposed along the length and across a width of a conductive line, proximate vias in an underlying material layer.

As yet another example, FIG. 11 illustrates a top view of another embodiment of the present invention, wherein a plurality of voids 612 is disposed along both the length and across the width of a conductive line 608. Each of the voids 612 is preferably disposed proximate vias 606 in an underlying material layer, as shown. Voids 664 may also be formed a third feature 622 disposed beneath the vias 606 between two adjacent vias 606. The vias 606 comprise an array of eight vias 606 comprising four rows and two columns. Alternatively, other numbers of vias may be included and may be formed in other numbers of rows and columns, for example, other than the configurations described herein.

Embodiments of the present invention further include lithography masks 340 and methods of designing lithography masks 340, as shown in FIG. 7. For example, in one embodiment, a lithography mask 340 includes a pattern 342 for at least one conductive line 308 (see FIG. 8) of a conductive material layer $M_1$ of a semiconductor device 300. The pattern 342 for the at least one conductive line 308 comprises a void 350 proximate a via contact region (see via contact regions 110 and 210 in the previous figures), the via contact region comprising a region where a plurality of vias 306 is coupleable to an at least one conductive line 308 patterned by the lithography mask 340.

In accordance with another embodiment, a method of designing a lithography mask 340 of FIG. 7 includes providing a layout for a conductive material layer such as $M_1$ or another level of metallization for a semiconductor device 300 (see FIG. 8), as shown in FIG. 6. The layout includes a pattern 342 for at least one conductive line 308 (again, see FIG. 8). The method includes modifying the pattern 342 of the at least one conductive line 308 to include a void 350 proximate a via contact region of the pattern 342 of the at least one conductive line 308, as shown in FIG. 7. Advantageously, the void 350 pattern is large enough to be reproduced on a material layer (e.g., such as the top view of layer $M_1$ of the semiconductor device 300 shown in FIG. 8) and improves the via 306 alignment, ensuring a full landing of the via 306 to the conductive line 308.

The novel method of designing a lithography mask 340 of FIG. 7 may be implemented as an additional step in a design process for a lithography mask 340. Alternatively, the methods of designing lithography masks 340 described herein may be implemented as at least a portion of an optical proximity correction (OPC) algorithm for a design process for the lithography mask 340, for example. Other OPC modifications, such as the additions of serifs, notches or protrusions to the patterns of features to improve the lithography process, may also be made to the layout or design of the conductive lines 108, 208, 308, 408, 422, 508, 522, 608, and 622 either before or after the void patterns 350 are included in the layout for the material layer $M_1$, or example.

Advantages of embodiments of the invention include providing novel methods of fabricating material layers $M_0$, $V_0$, and $M_1$ of semiconductor devices 100, 200, 300, 400, 500, and 600 that have improved lithography pattern transfer. The voids 112, 312, 412, 464, 512, 564, 612, and 664 comprise slots in the conductive line 108, 208, 308, 408, 422, 508, 522, 608, and 622 patterns that improve the alignment of the vias 106, 206, 306, 406, 506, and 606 and the conductive lines 108, 208, 308, 408, 422, 508, 522, 608, and 622. Because the voids 112, 312, 412, 464, 512, 564, 612, and 664 are formed in the patterns, the pattern transfer of the wide lines 108, 208, 308, 408, 422, 508, 522, 608, and 622 is improved, resulting in the vias 106, 206, 306, 406, 506, and 606 fully and completely aligning with the conductive lines 108, 208, 308, 408, 422, 508, 522, 608, and 622.

Near the voids 112, 312, 412, 464, 512, 564, 612, and 664, the pattern for the conductive lines 108, 208, 308, 408, 422, 508, 522, 608, and 622 is effectively separated into two or more separate narrow patterns for narrow conductive line portions, with one narrow pattern being disposed on either side of the void 112, 312, 412, 464, 512, 564, 612, and 664, preventing narrowing of the conductive line pattern during lithography and etch processes used to form the conductive lines 108, 208, 308, 408, 422, 508, 522, 608, and 622 and ensuring that the overall width $d_3$ of the slotted conductive lines 108, 208, 308, 408, 422, 508, 522, 608, and 622 patterned conforms with the desired width $d_3$ of the pattern on the mask 340 (see FIG. 7) in the slotted region proximate the void 350 in the pattern. Thus, because narrowing of the slotted conductive lines 108, 208, 308, 408, 422, 508, 522, 608, and 622 is prevented by the novel void pattern 350 on the mask 340, the via 106, 206, 306, 406, 506, and 606 contact coverage is increased or improved, and etch bias, e.g., in the formation of the vias 308, is prevented.

Embodiments of the present invention result in improved interconnect patterns with increased current drive capability and improved alignment of vias 106, 206, 306, 406, 506, and 606 to conductive lines 108, 208, 308, 408, 422, 508, 522, 608, and 622. Embodiments of the present invention are easily implementable in existing manufacturing process flows and lithography mask 340 designs, with few additional processing steps being required for implementation of the invention, for example. The novel embodiments of the invention described herein advantageously do not require the use of additional area under the design layout and are easily implementable into existing conventional layout designs without any ground rule violations, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lithography mask, comprising:
a pattern for at least one conductive line of a conductive material layer of a semiconductor device, the pattern for the at least one conductive line comprising at least one void proximate a via contact region, the via contact region comprising a region to couple a plurality of vias with an at least one conductive line patterned by the lithography mask.

2. The lithography mask according to claim 1, wherein the at least one void in the pattern for the at least one conductive line is disposed substantially in a central region of the via contact region.

3. The lithography mask according to claim 1, wherein the at least one void comprises a substantially square, rectangular, round, or elliptical shape.

* * * * *